US011374194B2

(12) United States Patent
Feng

(10) Patent No.: US 11,374,194 B2
(45) Date of Patent: Jun. 28, 2022

(54) STANDABLE ORGANIC LIGHT-EMITTING DIODE DISPLAY DEVICE

(71) Applicant: Wuhan China Star Optoelectronics Semiconductor Display Technology Co., Ltd., Wuhan (CN)

(72) Inventor: Zikang Feng, Wuhan (CN)

(73) Assignee: Wuhan China Star Optoelectronics Semicosdescter Display Techeology Co., Ltd., Wuhan (CN)

(*) Notice: Subject to any disclaimer, the term of this patent is extended or adjusted under 35 U.S.C. 154(b) by 311 days.

(21) Appl. No.: 16/638,485

(22) PCT Filed: Nov. 19, 2019

(86) PCT No.: PCT/CN2019/119433
§ 371 (c)(1),
(2) Date: Feb. 12, 2020

(87) PCT Pub. No.: WO2021/056768
PCT Pub. Date: Apr. 1, 2021

(65) Prior Publication Data
US 2021/0384459 A1 Dec. 9, 2021

(30) Foreign Application Priority Data

Sep. 25, 2019 (CN) .......................... 201910913666.9

(51) Int. Cl.
*H01L 51/52* (2006.01)
(52) U.S. Cl.
CPC .............................. *H01L 51/5237* (2013.01)
(58) Field of Classification Search
CPC .................................................. H01L 51/5237
(Continued)

(56) References Cited

U.S. PATENT DOCUMENTS 10,310,565 B2 * 6/2019 Aoki ..................... G06F 1/1652
10,551,880 B1 * 2/2020 Ai ......................... G06F 1/1652
(Continued)

FOREIGN PATENT DOCUMENTS

CN 106652798 5/2017
CN 106652852 5/2017
(Continued)

OTHER PUBLICATIONS

Lim et al. "Fast Switching and Low Operating Vertical Alignment Liquid Crystal Display With 3-D Polymer Network for Flexible Display", IEEE Transactions on Electron Devices, 64(3): 1083-19087, Published Online Jan. 10, 2017.

*Primary Examiner* — Xia L Cross

(57) ABSTRACT

The present disclosure provides a standable OLED display device comprising a first shell, a second shell, a support plate, four first rods, and an OLED panel. The first shell and the second shell have sliders and chutes. Each slider partially slides in a corresponding chute. Two first rods are rotatably connected to the first shell and the support plate. Two other first rods are rotatably connected to the second shell and the support plate. The OLED panel is disposed on the support plate, the first shell, and the second shell, and two opposite sides thereof are respectively inserted in the first shell and the second shell. When the first shell and the second shell slide close to each other, the support plate rises in parallel with respect to the first shell and the second shell so that the device is changed from an initial planar state to a standing state.

10 Claims, 5 Drawing Sheets

(58) Field of Classification Search
USPC .......................................................... 257/40
See application file for complete search history.

(56) References Cited

U.S. PATENT DOCUMENTS

| | | |
|---|---|---|
| 2016/0374228 A1 | 12/2016 | Park et al. |
| 2017/0156219 A1 | 6/2017 | Hco et al. |
| 2020/0025325 A1 | 1/2020 | Wu et al. |

FOREIGN PATENT DOCUMENTS

| | | |
|---|---|---|
| CN | 107835914 | 3/2018 |
| CN | 108109538 | 6/2018 |
| CN | 207781089 | 8/2018 |
| CN | 110010007 | 7/2019 |
| CN | 110033707 | 7/2019 |
| CN | 110047387 | 7/2019 |
| EP | 3107082 | 12/2016 |
| WO | WO 2016/102981 | 6/2016 |

\* cited by examiner

STANDABLE ORGANIC LIGHT-EMITTING DIODE DISPLAY DEVICE

RELATED APPLICATIONS

This application is a National Phase of PCT Patent Application No. PCT/CN2019/119433 having International filing date of Nov. 19, 2019, which claims the benefit of priority Chinese Patent Application No. 201910913666.9 filed on Sep. 25, 2019. The contents of the above applications are all incorporated by reference as if fully set forth herein in their entirety.

FIELD AND BACKGROUND OF THE INVENTION

The present disclosure relates to the field of organic light-emitting diode (OLED) panel technology, and particularly to a standable OLED display device.

Organic light-emitting diode (OLED) panels can be folded or rolled up due to its flexibility, so that a display device with a large-sized OLED panel has good portability. However, in current technology, it is still necessary to develop a display device that can change between a planar state and a standing state.

SUMMARY OF THE INVENTION

An object of the present invention is to provide a standable organic light-emitting diode (OLED) display device that can change between a planar state and a standing state, so as to solve the problem in the prior art.

In order to solve the above technical problem, the present disclosure provides a standable OLED display device comprising a first shell, a second shell, a support plate, four first rods, and an OLED panel. The first shell comprises a first shell body, a plurality of first sliders, and a plurality of first chutes. The first sliders and the first chutes are alternately disposed on the first shell body. The second shell comprises a second shell body, a plurality of second sliders, and a plurality of second chutes. The second sliders and the second chutes are alternately disposed on the second shell body. Each of the first sliders partially slides in a corresponding second chute, and Each of the second sliders partially slides in a corresponding first chute. The support plate is disposed between the first shell and the second shell and on a same plane as the first shell and the second shell. Two of the four first rods are rotatably connected to the first shell and the support plate, and the other two of the four first rods are rotatably connected to the second shell and the support plate. The OLED panel is disposed on the support plate, the first shell, and the second shell. Two opposite sides of the OLED panel are inserted in the first shell and the second shell, respectively.

In an embodiment, when the first sliders and the second sliders completely slide into the corresponding first chutes and the corresponding second chutes, the four first rods respectively rotate toward a direction perpendicular to the first shell or the second shell, the support plate rises parallel to the first shell and the second shell, and the standable OLED display device is changed from an initial planar state to a standing state.

In an embodiment, the standable OLED display device further comprises two spiral springs respectively disposed in the first shell and the second shell, and respectively connected to the two opposite sides of the OLED panel. The spiral springs are configured to make the OLED panel closely contact the first shell, the second shell, and the support plate.

In an embodiment, the standable OLED display device further comprises two pulleys respectively disposed in the first shell and the second shell, which are used to reduce friction between the OLED panel and the first shell and friction between the OLED panel and the second shell.

In an embodiment, the standable OLED display device further comprises two rotating shafts respectively disposed on two opposite sides of the support plate, which are used to reduce friction between the OLED panel and the support plate.

In an embodiment, when the standable OLED display device is in the standing state, the standable OLED display device is placed on a plane using the first shell and the second shell as a bottom, or using the two first rods disposed on a same side of the standable OLED display as a bottom.

In an embodiment, when the standable OLED display device is changed from the standing state to the initial planar state, the first shell and the second shell slide away from each other via the first sliders, the first chutes, the second sliders, and the second chutes until the first shell and the second shell are restricted from sliding by the four first rods and the support plate.

In an embodiment, the standable OLED display device further comprises four second rods, wherein two of the four second rods are rotatably connected to the first shell and the support plate, and the other two of the four second rods are rotatably connected to the second shell and the support plate.

In an embodiment, when the standable OLED display device is in the planar state, the four second rods are parallel to the first shell and the second shell. When the standable OLED display device is changed from the initial planar state to the standing state, the four second rods respectively rotate toward a direction perpendicular to the first shell or the second shell.

In an embodiment, when the standable OLED display device is in the standing state, the standable OLED display device is placed on a plane using the first shell and the second shell as a bottom, or using the two first rods and the two second rods disposed on a same side of the standable OLED display as a bottom.

In the standable OLED display device provided by the present disclosure, the first shell and the second shell can slide away from or close to each other via their sliders and chutes, and the support plate are correspondingly moved up or down in parallel via the first rods and/or the second rods. Therefore, the standable OLED display device can be changed between the planar state and the standing state. Furthermore, when the standable OLED display device is changed between the planar state and the standing state, the two spiral springs respectively disposed in the first shell and the second shell correspondingly rollup or release the OLED panel so that the OLED panel always closely contacts the first shell, the second shell, and the support plate. In addition, when the standable OLED display device is changed between the planar state and the standing state, the two pulleys respectively disposed in the first shell and the second shell respectively reduce the friction between the OLED panel and the first shell and the friction between the OLED panel and the second shell, and the two rotating shafts respectively disposed on the two opposite sides of the support plate reduce the friction between the OLED panel and the support plate.

BRIEF DESCRIPTION OF THE SEVERAL VIEWS OF THE DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Figure 1:
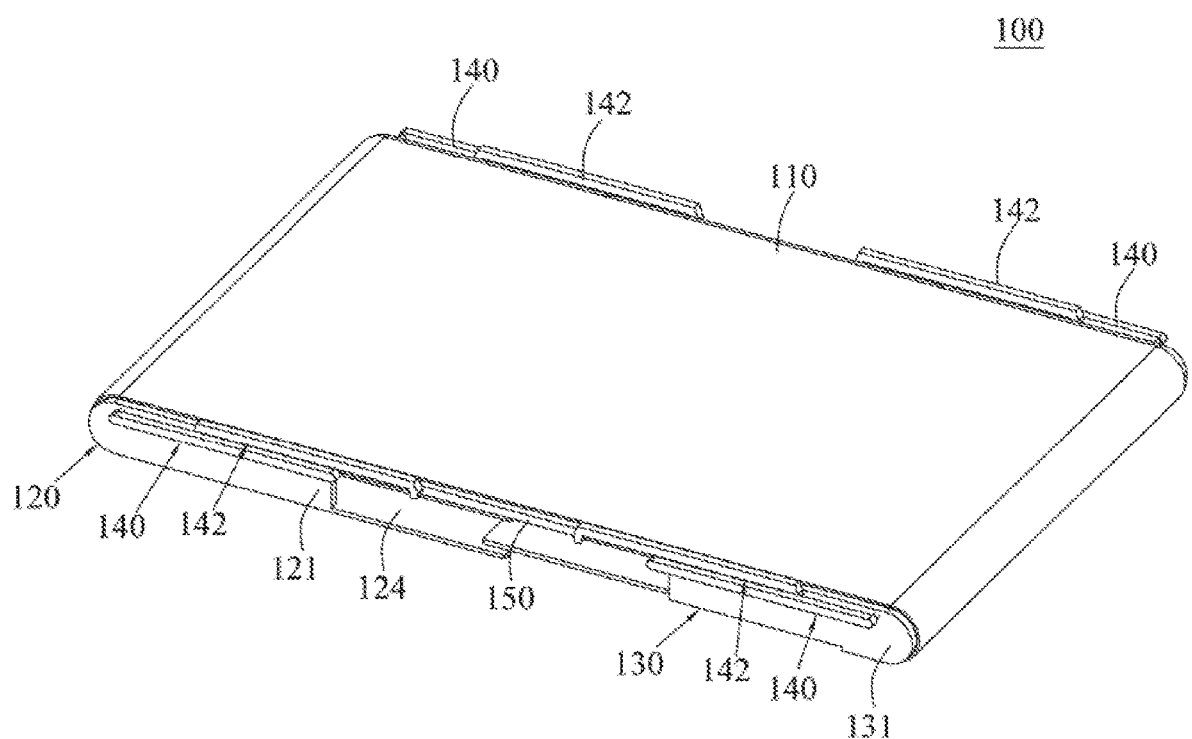
FIG. 1 and FIG. 2 are different perspective views of a standable organic light-emitting diode (OLED) display device in a planar state according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "top", "bottom", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals.

Figure 2:
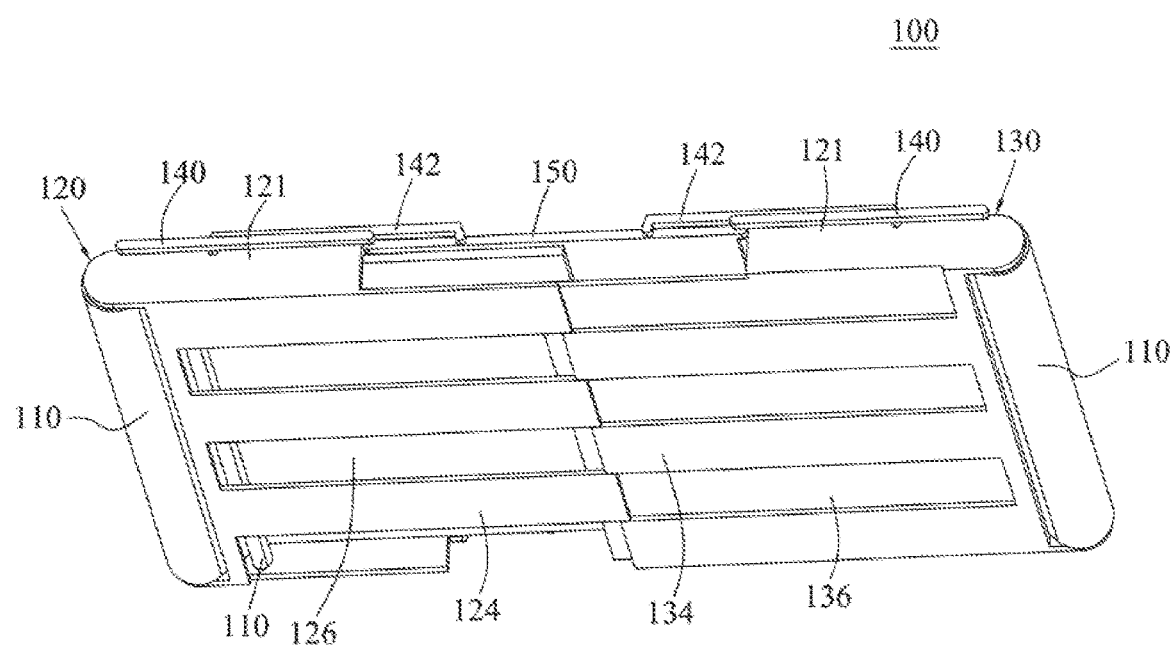
Figure 3:
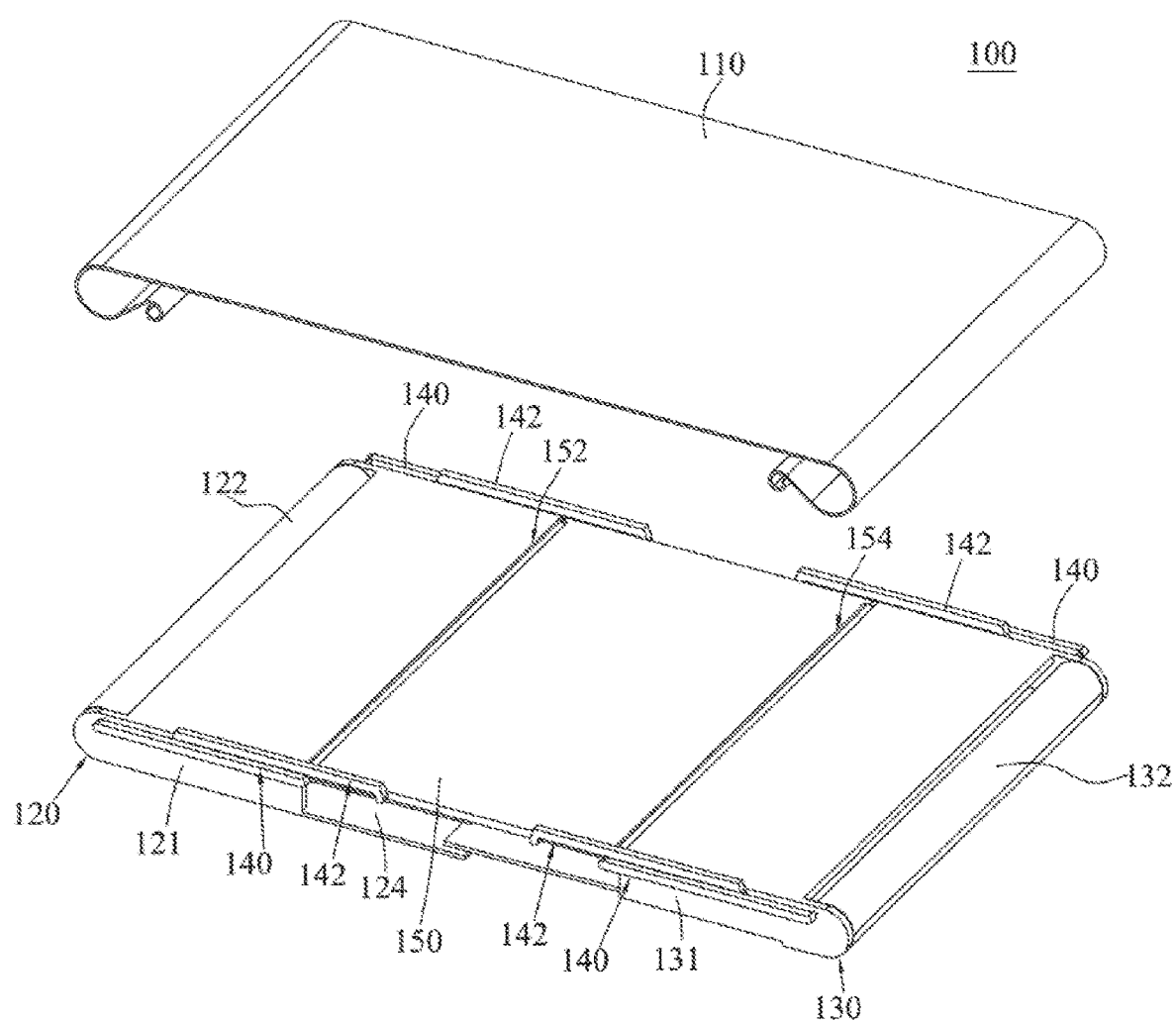
FIG. 3 is an exploded view of the standable OLED display device of FIG. 1.
Figure 4:
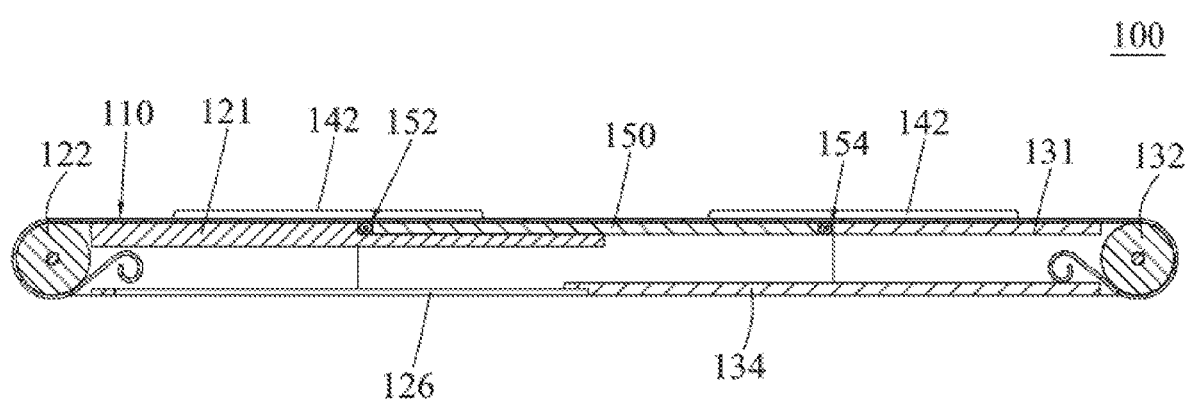
FIG. 4 is a cross-sectional view of the standable OLED display device of FIG. 1.

Please refer to FIG. 1 to FIG. 4. FIG. 1 and FIG. 2 are different perspective views of a standable organic light-emitting diode (OLED) display device in a planar state according to an embodiment of the present disclosure. FIG. 3 is an exploded view of the standable OLED display device 100 of FIG. 1. FIG. 4 is a cross-sectional view of the standable OLED display device 100 of FIG. 1. The present disclosure provides a standable OLED display device 100 comprising an OLED panel 110, a first shell 120, a first pulley 122, a second shell 130, a second pulley 132, a plurality of first rods 140, a plurality of second rods 142, a support plate 150, a first rotating shaft 152, and a second rotating shaft 154. The first shell 120 comprises a first shell body 121, a plurality of first sliders 124, and a plurality of first chutes 126. The first sliders 124 and the first chutes 126 are alternately disposed on the first shell body 121. The second shell 130 comprises a second shell body 131, a plurality of second sliders 134, and a plurality of second chutes 136. The second sliders 134 and the second chutes 136 are alternately disposed on the second shell body 131. Each of the first sliders 124 partially slides in a corresponding second chute 136, and each of the second sliders 134 partially slides in a corresponding first chute 126, so that the first shell 120 and the second shell 130 can slide away from or close to each other. The first pulley 122 is disposed on a side of the first shell 120 away from the second shell 130. The second pulley 132 is disposed on a side of the second shell 130 away from the first shell 120. The first rotating shaft 152 and the second rotating shaft 154 are respectively disposed on two opposite sides of the support plate 150. Ends of two first rods 140 are respectively rotatably connected to opposite sides of the first shell 120 and are close to the first pulley 122, and the other ends of the of two first rods 140 are respectively rotatably connected to opposite sides of the support plate 150 and are close to the first rotating shaft 152. Ends of two other first rods 140 are respectively rotatably connected to opposite sides of the second shell 130 and are close to the second pulley 132, and the other ends of the of the two other first rods 140 are respectively rotatably connected to opposite sides of the support plate 150 and are close to the second rotating shaft 154. Ends of two second rods 142 are respectively rotatably connected to opposite sides of the first shell 120 and are close to a middle of the first shell 120, and the other ends of the of two second rods 142 are respectively rotatably connected to opposite sides of the support plate 150 and are close to a middle of the support plate 150. Ends of two other second rods 142 are respectively rotatably connected to opposite sides of the second shell 130 and are close to a middle of the second shell 130, and the other ends of the of the two other second rods 142 are respectively rotatably connected to opposite sides of the support plate 150 and are close to a middle of the support plate 150. One side of the OLED panel 110 surrounds the first pulley 122 and is inserted into the first shell 120, and an opposite side thereof surrounds the second pulley 132 and is inserted into the second shell 130. In an embodiment, the standable OLED display device 100 further comprises two spiral springs (not shown) respectively disposed in the first shell 120 and the second shell 130, and respectively connected to the two opposite sides of the OLED panel 110. The two spiral springs are similar to coil springs used in general measuring tapes. Each spiral spring may be made of a steel strip, preferably a stainless steel strip. The material of the spiral springs may also be other elastic materials, for examples, non-ferrous metals such as copper alloys, nickel alloys, and titanium alloys, and polymer materials such as plastics and rubber. The two spiral springs apply a pre-tensioning force to the OLED panel 110 so that the OLED panel 110 closely contacts the first shell 120, the second shell 130, and the support plate 150.

The first shell 120 and the second shell 130 slide away from each other via the first sliders 124, the first chutes 126, the second sliders 134, and the second chutes 136 until the first shell 120 and the second shell 130 are restricted from sliding by the first rods 140, the second rods 142, and the support plate 150. At this time, only a small part of Each of the first sliders 124 is in a corresponding second sliding chute 136, and only a small part of Each of the second sliders 134 is in a corresponding first sliding chute 126. The first rods 140 and the second rods 142 are parallel to the first shell 120 and the second shell 130. The support plate 150, the first shell 120, and the second shell 130 are on a same plane and collectively support the OLED panel 110. At this time, the standable OLED display device 100 is in a planar state and used as a flat panel display device.

Figure 5:
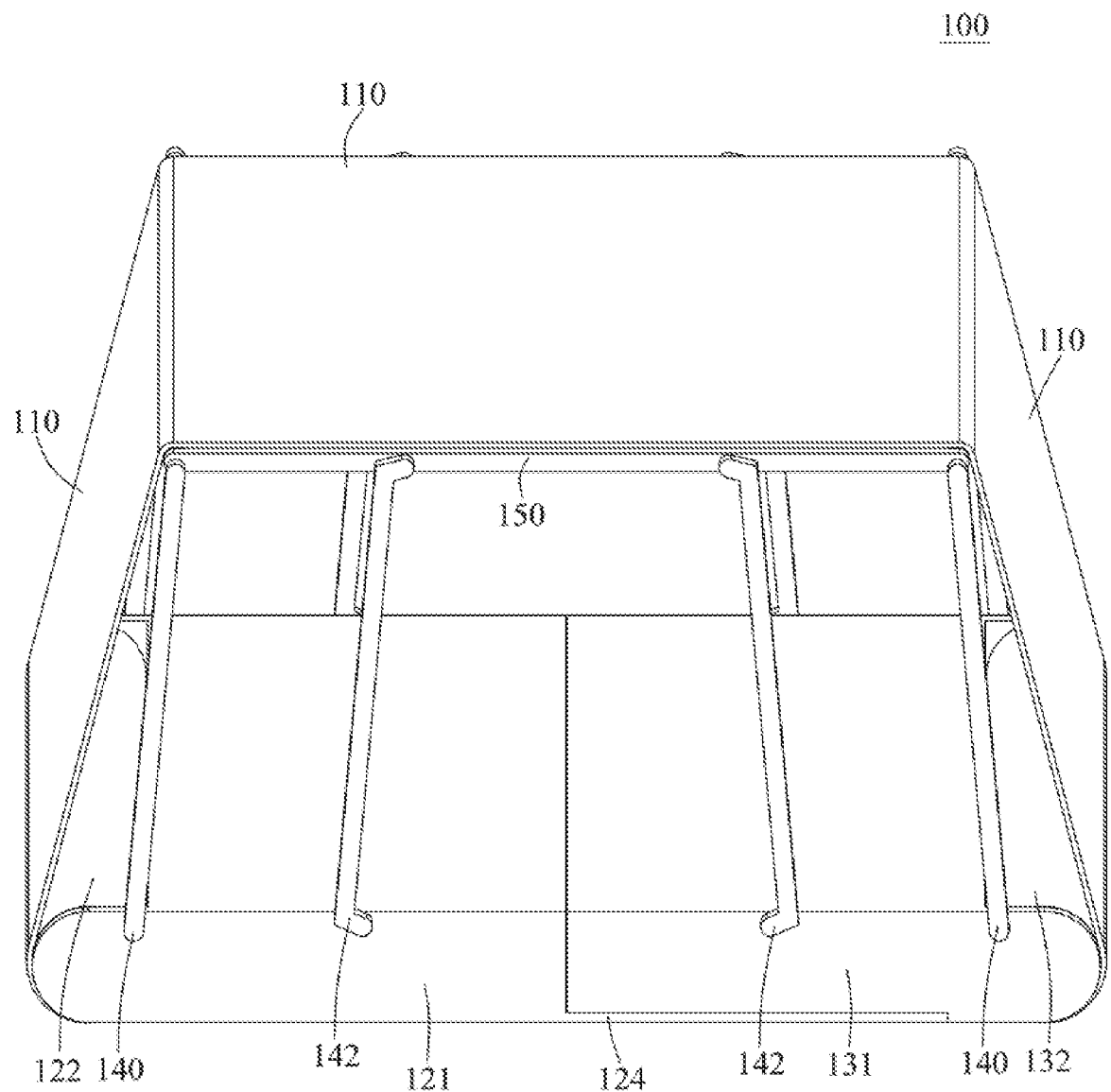
FIG. 5 and FIG. 6 are different perspective views of the standable OLED display device of FIG. 1 in a standing state.
Figure 6:
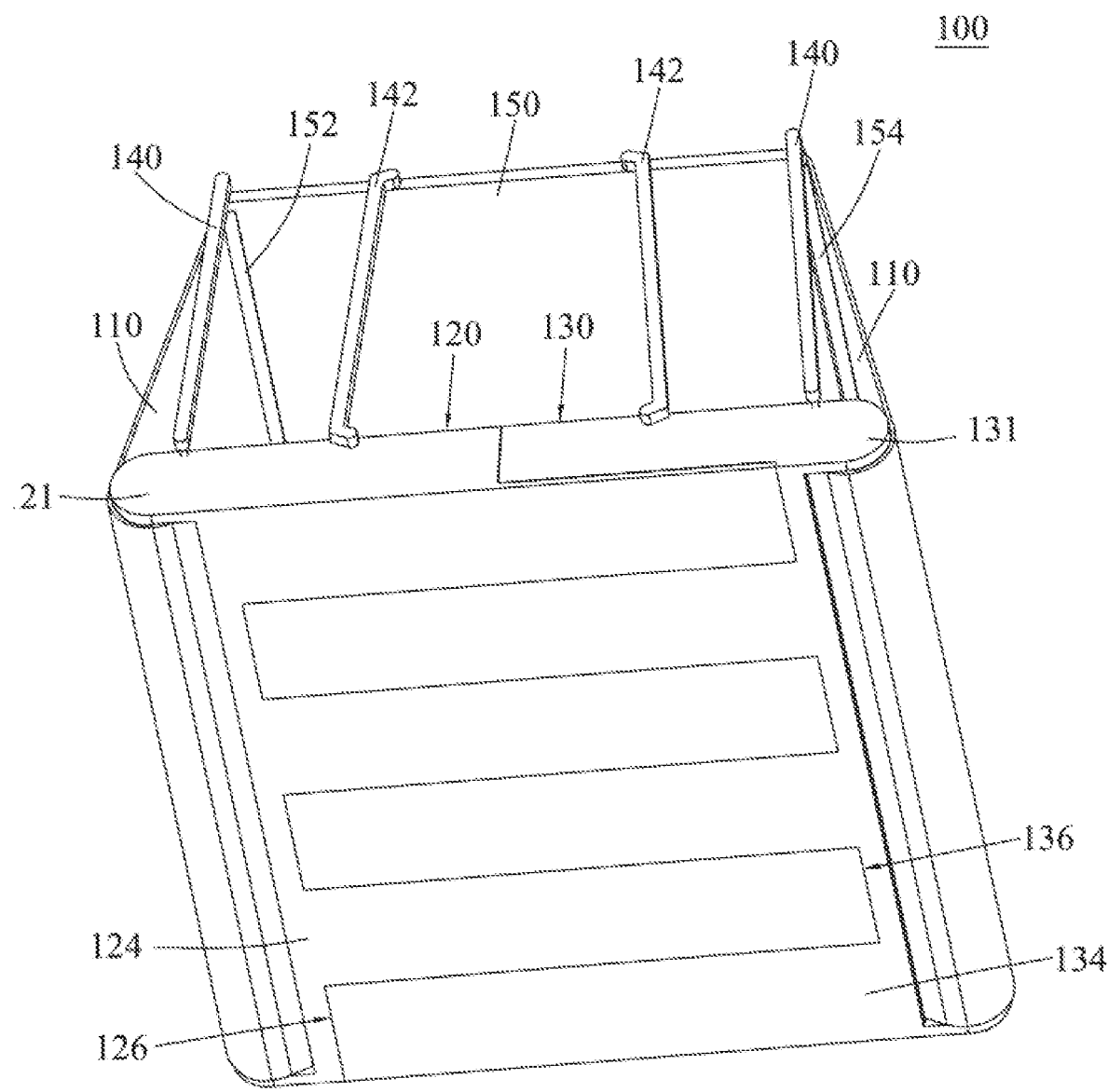
Figure 7:
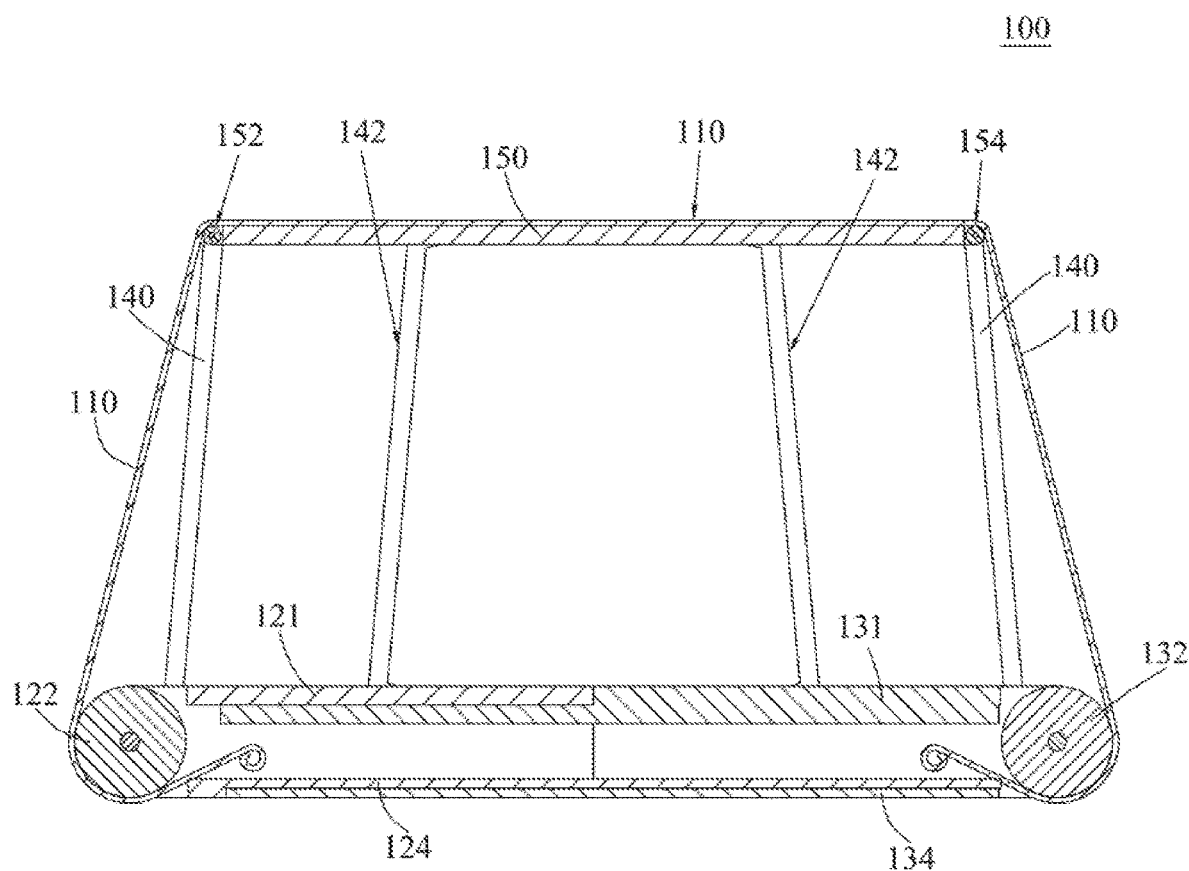
FIG. 7 is a cross-sectional view of the standable OLED display device of FIG. 5.

Please refer to FIG. 5 to FIG. 7. FIG. 5 and FIG. 6 are different perspective views of the standable OLED display device 100 of FIG. 1 in a standing state. FIG. 7 is a cross-sectional view of the standable OLED display device 100 of FIG. 5. Taking the planar state of FIG. 1 as an initial state, the first shell 120 and the second shell 130 slide close to each other via the first sliders 124, the first chutes 126, the second sliders 134, and the second chutes 136 until Each of the first sliders 124 completely slides into a corresponding second chute 136, and Each of the second sliders 134 completely slides into a corresponding first chute 126. Such that, the four first rods 140 and the four second rods 142 respectively rotate toward a direction perpendicular to the first shell 120 or the second shell 130, and the support plate 150 rises parallel to the first shell 120 and the second shell 130. At this time, the standable OLED display device 100 is in a standing state with a trapezoidal structure. When the standable OLED display device 100 is in the standing state, the standable OLED display device 100 may be placed on a plane using the first shell 120 and the second shell 130 as a bottom, or using the two first rods 140 and the two second rods 142 disposed on a same side of the standable OLED display 100 as a bottom.

When the first shell 120 and the second shell 130 slide away from or close to each other, the first rods 140 and the second rods 142 correspondingly move the support plate 150 up or down relative to the first shell 120 and the second shell 130 and allow the support plate 150 to be always parallel to the first shell 120 and the second shell 130. Furthermore, the two spiral springs correspondingly roll up or release the OLED panel 110 via their pre-tensioning force so that the OLED panel 110 always closely contacts the first shell 120, the second shell 130, and the support plate 150. That is, a length of the OLED panel 110 always matches structures of the standable OLED display device 100. In addition, when the OLED panel 110 is moved due to the support plate 150 rising or falling or is released or rolled up by the two spiral springs, the first pulley 122 and the second pulley 132 respectively reduce the friction between the OLED panel 110 and the first shell 120 and the friction between the OLED panel 110 and the second shell 130, and the first rotating shaft 152 and the second rotating shaft 154 reduce the friction between the OLED panel 110 and the support plate 150. In an embodiment, the OLED panel 110 may be attached or plated with a protective film (not shown) to prevent the OLED panel 110 from being damaged due to repeated friction with the first shell 120, the second shell 130, and the support plate 150.

In FIGS. 1-7, the first sliders 124 and the first chutes 126 of the first shell 120, and the second sliders 134 and the second chutes 136 of the second shell 130 are shown for illustration only. In an embodiment, the first shell 120 and the second shell 130 may have other types of slider-chute structure.

In the standable OLED display device provided by the present disclosure, the first shell and the second shell can slide away from or close to each other via their sliders and chutes, and the support plate are correspondingly moved up or down in parallel via the first rods and the second rods. Therefore, the standable OLED display device can be changed between the planar state and the standing state. Furthermore, when the standable OLED display device is changed between the planar state and the standing state, the two spiral springs respectively disposed in the first shell and the second shell correspondingly rollup or release the OLED panel so that the OLED panel always closely contacts the first shell, the second shell, and the support plate. In addition, when the standable OLED display device is changed between the planar state and the standing state, the two pulleys respectively disposed in the first shell and the second shell respectively reduce the friction between the OLED panel and the first shell and the friction between the OLED panel and the second shell, and the two rotating shafts respectively disposed on the two opposite sides of the support plate reduce the friction between the OLED panel and the support plate.

The present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A standable organic light-emitting diode (OLED) display device, comprising:
   a first shell comprising a first shell body, first sliders, and first chutes, wherein the first sliders and the first chutes are alternately disposed on the first shell body;
   a second shell comprising a second shell body, second sliders, and second chutes, wherein the second sliders and the second chutes are alternately disposed on the second shell body, each of the first sliders partially slides in a corresponding second chute, and each of the second sliders partially slides in a corresponding first chute;
   a support plate disposed between the first shell and the second shell and on a same plane as the first shell and the second shell;
   four first rods, wherein two of the four first rods are rotatably connected to the first shell and the support plate, and the other two of the four first rods are rotatably connected to the second shell and the support plate; and
   an OLED panel disposed on the support plate, the first shell, and the second shell, wherein two opposite sides of the OLED panel are inserted in the first shell and the second shell, respectively.

2. The standable OLED display device according to claim 1, wherein when the first sliders and the second sliders completely slide into the corresponding first chutes and the corresponding second chutes, the four first rods respectively rotate toward a direction perpendicular to the first shell or the second shell, the support plate rises parallel to the first shell and the second shell, and the standable OLED display device is changed from an initial planar state to a standing state.

3. The standable OLED display device according to claim 2, wherein when the standable OLED display device is in the standing state, the standable OLED display device is placed on a plane using the first shell and the second shell as a bottom, or using two of the four first rods disposed on a same side of the standable OLED display as a bottom.

4. The standable OLED display device according to claim 2, wherein when the standable OLED display device is changed from the standing state to the initial planar state, the first shell and the second shell slide away from each other via the first sliders, the first chutes, the second sliders, and the second chutes until the first shell and the second shell are restricted from sliding by the four first rods and the support plate.

5. The standable OLED display device according to claim 2, further comprising four second rods, wherein two of the four second rods are rotatably connected to the first shell and the support plate, and the other two of the four second rods are rotatably connected to the second shell and the support plate.

6. The standable OLED display device according to claim 5, wherein when the standable OLED display device is in the initial planar state, the four second rods are parallel to the first shell and the second shell, and when the standable OLED display device is changed from the planar state to the standing state, the four second rods respectively rotate toward a direction perpendicular to the first shell or the second shell.

7. The standable OLED display device according to claim 6, wherein when the standable OLED display device is in the standing state, the standable OLED display device is placed on a plane using the first shell and the second shell as a bottom, or using the two first rods and two of the four second rods disposed on a same side of the standable OLED display as a bottom.

8. The standable OLED display device according to claim 1, further comprising two spiral springs respectively disposed in the first shell and the second shell, and respectively connected to the two opposite sides of the OLED panel, wherein the spiral springs are configured to make the OLED panel closely contact the first shell, the second shell, and the support plate.

9. The standable OLED display device according to claim 1, further comprising two pulleys respectively disposed in the first shell and the second shell, which are used to reduce friction between the OLED panel and the first shell and friction between the OLED panel and the second shell.

10. The standable OLED display device according to claim 1, further comprising two rotating shafts respectively disposed on two opposite sides of the support plate, which are used to reduce friction between the OLED panel and the support plate.

* * * * *